(12) United States Patent
Kim

(10) Patent No.: US 7,821,852 B2
(45) Date of Patent: Oct. 26, 2010

(54) WRITE DRIVING CIRCUIT

(75) Inventor: Taek Seung Kim, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 227 days.

(21) Appl. No.: 12/005,700

(22) Filed: Dec. 28, 2007

(65) Prior Publication Data

US 2009/0052263 A1 Feb. 26, 2009

(30) Foreign Application Priority Data

Aug. 23, 2007 (KR) ........................ 10-2007-0085154

(51) Int. Cl.
G11C 7/10 (2006.01)
G11C 29/36 (2006.01)
G11C 29/00 (2006.01)

(52) U.S. Cl. ........................ 365/200; 365/201; 365/194; 365/205; 365/207; 365/208; 365/189.05; 365/189.08; 365/189.12; 365/230.03; 365/230.08

(58) Field of Classification Search .................. 365/201, 365/230.03, 230.06
See application file for complete search history.

(56) References Cited

U.S. PATENT DOCUMENTS

| | | | |
|---|---|---|---|
| 6,201,421 B1 | 3/2001 | Takeuchi | |
| 6,301,169 B1 * | 10/2001 | Kikuda et al. | 365/201 |
| 6,496,429 B2 * | 12/2002 | Murai et al. | 365/200 |
| 6,574,151 B2 | 6/2003 | Park | |
| 6,574,159 B2 * | 6/2003 | Ohbayashi et al. | 365/201 |
| 6,741,511 B2 * | 5/2004 | Nakao | 365/201 |
| 7,187,195 B2 * | 3/2007 | Kim | 326/16 |
| 7,492,653 B2 * | 2/2009 | Ku et al. | 365/201 |
| 7,576,560 B2 * | 8/2009 | Kim | 326/30 |

FOREIGN PATENT DOCUMENTS

| | | |
|---|---|---|
| JP | 2006-114192 | 4/2006 |
| KR | 10-2005-0071805 A | 7/2005 |
| KR | 10-2007-0036616 | 4/2007 |

\* cited by examiner

*Primary Examiner*—Vibol Tan
(74) *Attorney, Agent, or Firm*—John P. White; Cooper & Dunham LLP

(57) ABSTRACT

A write driving circuit is provided to drive a global input/output line to write same data to memory cells according to a combination of a first test data signal and a second test data signal in a test mode, regardless of input data signals.

17 Claims, 5 Drawing Sheets

WRITE DRIVING CIRCUIT

BACKGROUND

The present disclosure relates to a semiconductor memory device, and more particularly, to a write driving circuit.

FIG. 1 illustrates a block diagram of a conventional write driving circuit.

Referring to FIG. 1, the conventional write driving circuit includes an input buffer 100, an input latch 200, a serial-to-parallel converter 300, and a global input/output (GIO) write driver 400. The write driving circuit applied to an X16 DDR2 memory semiconductor is illustrated in FIG. 1.

The input buffer 100 (101-116) converts data signals DIN<0:15> input through data input pads into complementary metal-oxide semiconductor (CMOS) level signals. A signal WTEN enables the input buffer 100 in a write operation.

The input latch 200 (201-216) latches output signals of the input buffers 100 (101-116) according to a strobe signal (not shown).

The serial-to-parallel converter 300 (301-316) converts serial data signals having passed the input buffers 100 (101-116) and the input latches 200 (201-216) into parallel data signals. Bit data signals input on a 1-bit basis are converted into 4-bit data signals by the serial-to-parallel converter 300 (301-316).

The GIO write driver 400 drives GIO lines according to the input four-bit data signals.

FIG. 2 illustrates a circuit diagram for the write driver of FIG. 1. Referring to FIG. 2, a conventional write driver 400 receives four-bit data signals DINEV0, DINOD0, DINEV1 and DINOD1 output from the serial-to-parallel converter 300 to output signals GIOQ0, GIOQ1, GIOQ2 and GIOQ3.

When the signal DINEV0 has a logic high level, both inverters IV1 and IV2 output low level signals to turn on a PMOS transistor P1 and turn off a NMOS transistor N1, thereby outputting a signal GIOQ0 of a logic high level. When the signal DINEV0 has a logic low level, both the inverters IV1 and IV2 output high level signals to turn off the PMOS transistor P1 and turn on the NMOS transistor N1, thereby outputting a signal GIOQ0 of a logic low level.

The operations of inverters IV3 to IV8, PMOS transistors P2 to P4 and NMOS transistors N2 to N4 according to the signals DINOD0, DINEV1 and DINOD1 are the same as the operations of the inverters IV1 and IV2, the PMOS transistor P1 and the NMOS transistor N1 according to the signal DINEV0.

A burn-in test for a semiconductor memory is a lifetime test which is performed on a lot of chips for a long time under worst case conditions. It is generally desirable to perform a burn-in test on a lot of chips at a time so as to improve test productivity. However, in semiconductor chips using all of the sixteen data input pins, there is a limitation in testing a lot of chips using sixteen data pins at a time because a test apparatus typically has finite input and output terminals.

BRIEF SUMMARY

Various examples and embodiments of the present disclosure provide a write driving circuit which can write data on entire memory cells at a time in a test mode for detecting defective memory cells after a burn-in test.

In an aspect of the present disclosure, a write driving circuit includes a write driver configured to drive a global input/output line according to a first test data signal and a second test data signal in a test mode, regardless of input data signals.

In the test mode, the write driving circuit may be configured to write same data on memory cells according to a combination of the first test data signal and the second test data signal.

In another aspect, a write driving circuit includes an input buffer configured to buffer an input data signal, the input buffer being disabled in a test mode, a latch configured to latch an output signal of the input buffer, a serial-to-parallel converter configured to convert an output signal of the latch into parallel data signals, and a write driver configured to drive a global input/output line in response to a first test data signal and a second test data signal in the test mode, regardless of the data signal input from the serial-to-parallel converter.

In still another aspect, a write driving circuit includes an input buffer configured to buffer an input data signal, a latch configured to latch an output signal of the input buffer, a serial-to-parallel converter configured to convert an output signal of the latch into parallel data signals, an input buffer controller configured to output a control signal for controlling the input buffer in response to a test mode signal, and a write driver configured to drive a global input/output line in response to a first test data signal and a second test data signal in the test mode, regardless of the data signal input from the serial-to-parallel converter.

DESCRIPTION OF EXEMPLARY EMBODIMENTS

Hereinafter, a write driving circuit in accordance with examples and exemplary embodiments of the present disclosure will be described in detail with reference to the accompanying drawings.

Figure 1:
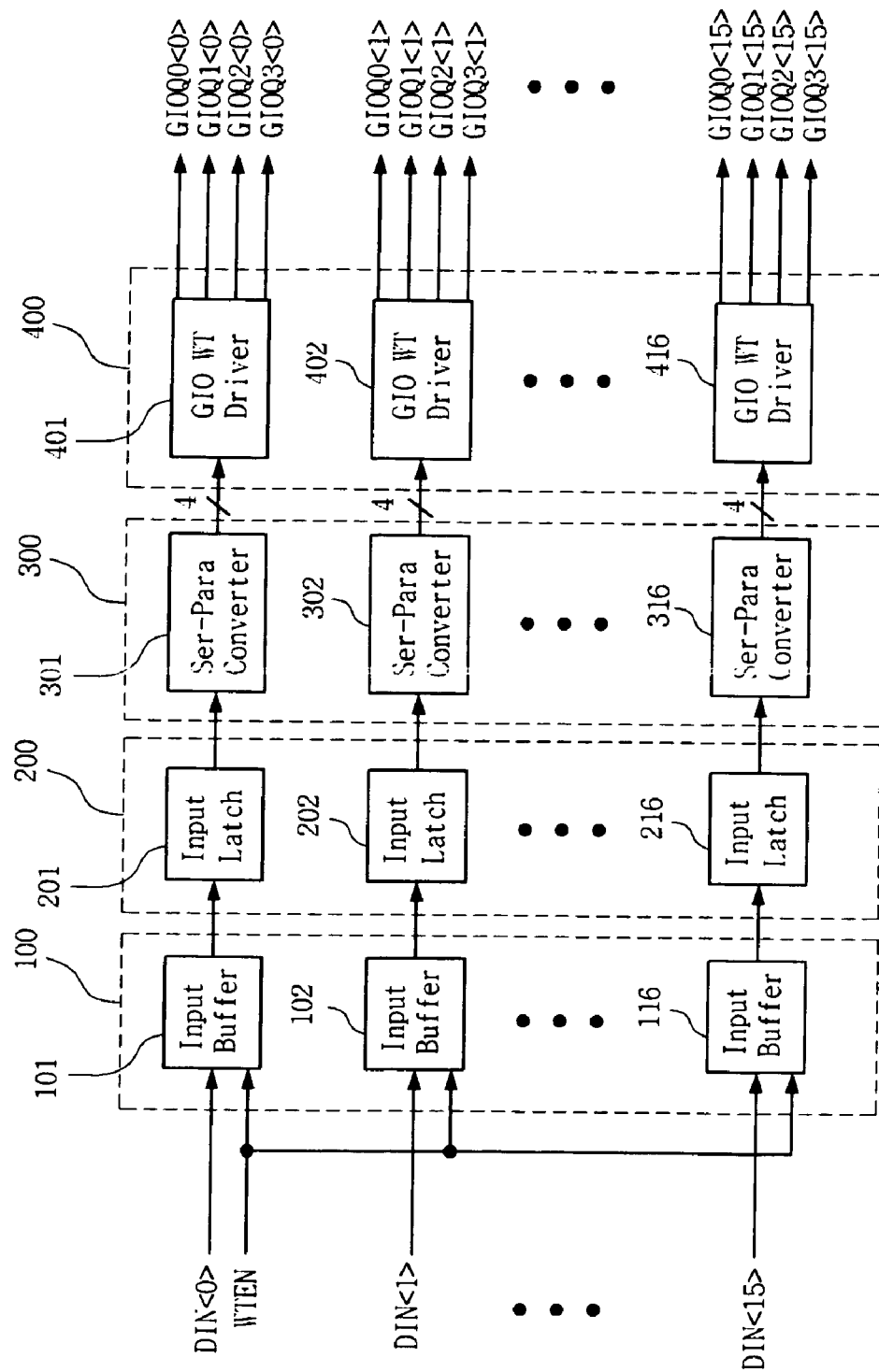
FIG. 1 illustrates a block diagram of a conventional write driving circuit.
Figure 2:
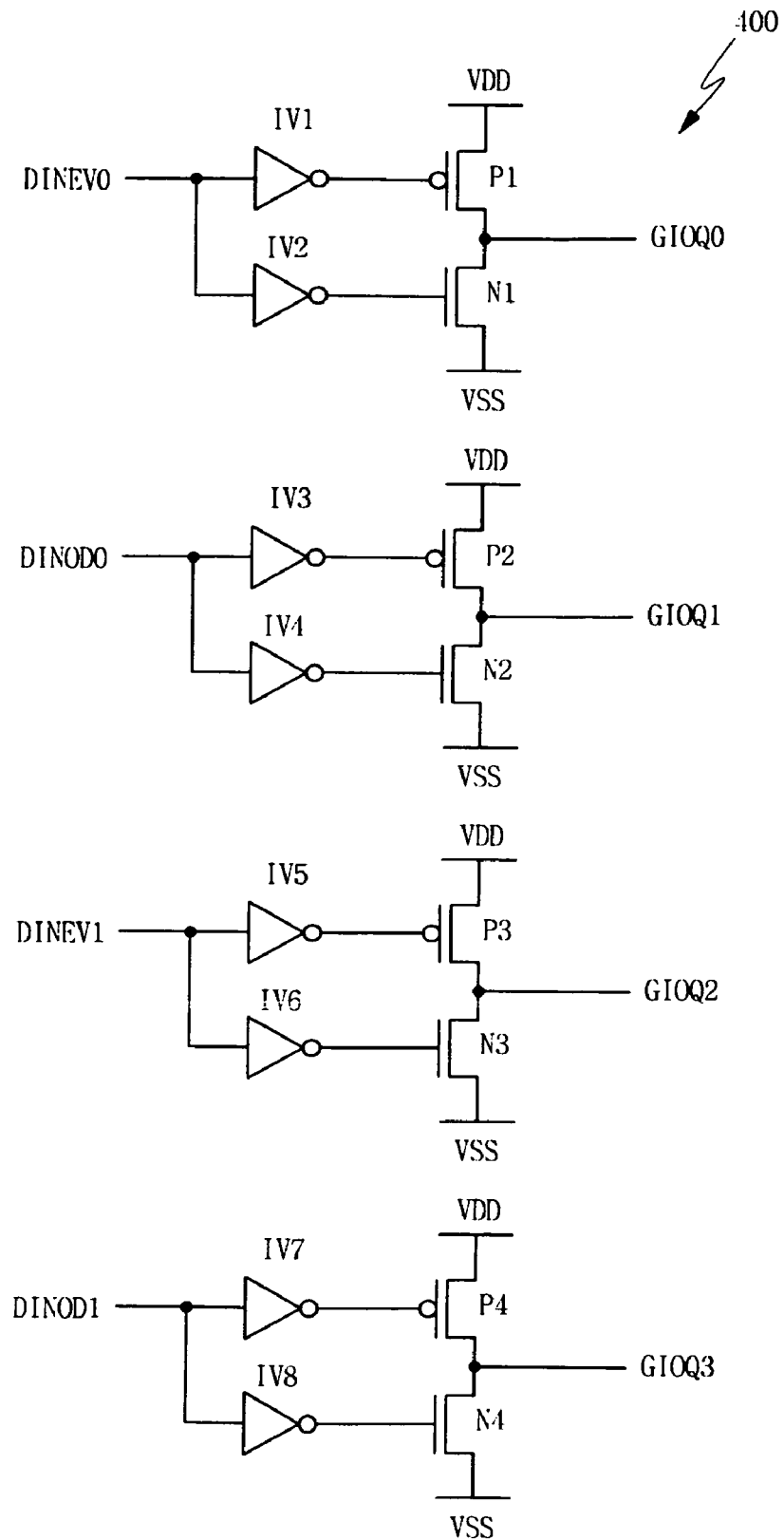
FIG. 2 illustrates a circuit diagram of a write driver shown in FIG. 1.
Figure 3:
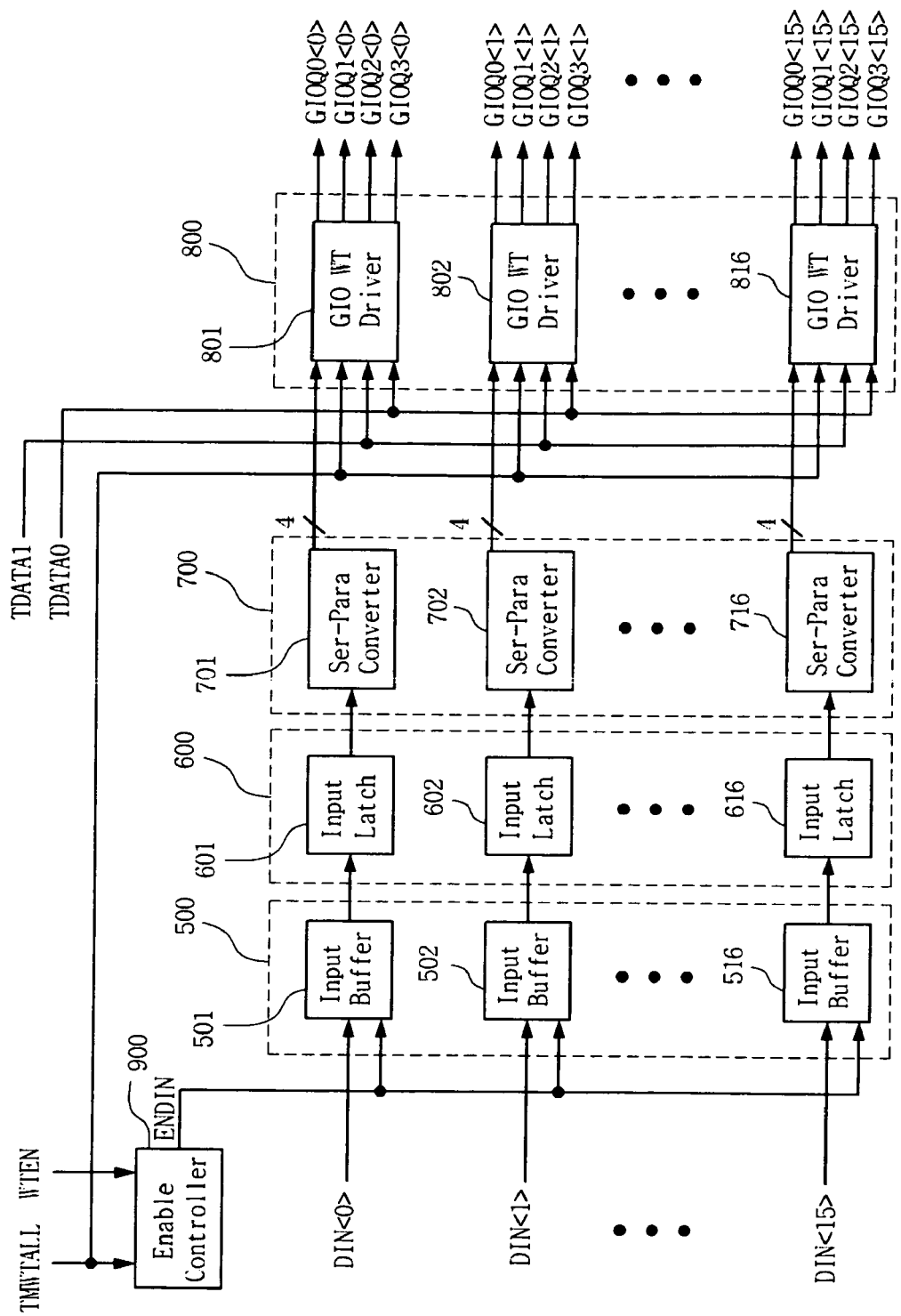
FIG. 3 illustrates a block diagram of a write driving circuit according to an exemplary embodiment of the present disclosure.
Figure 4:
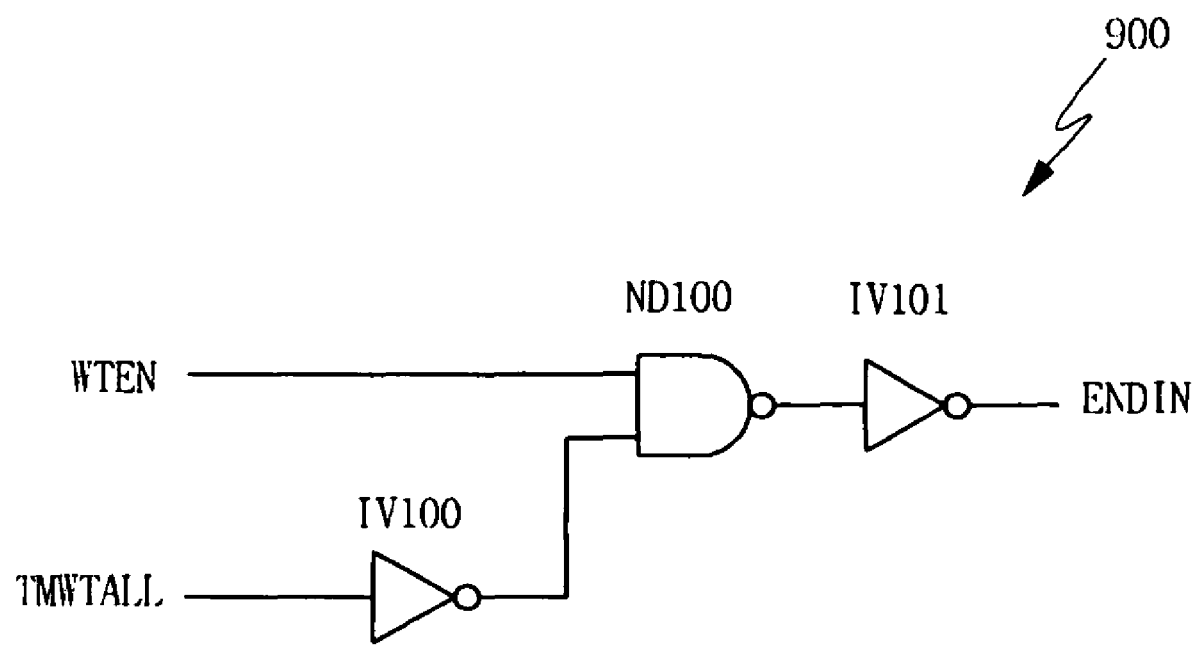
FIG. 4 illustrates a circuit diagram of an input buffer controller shown in FIG. 3.
Figure 5:
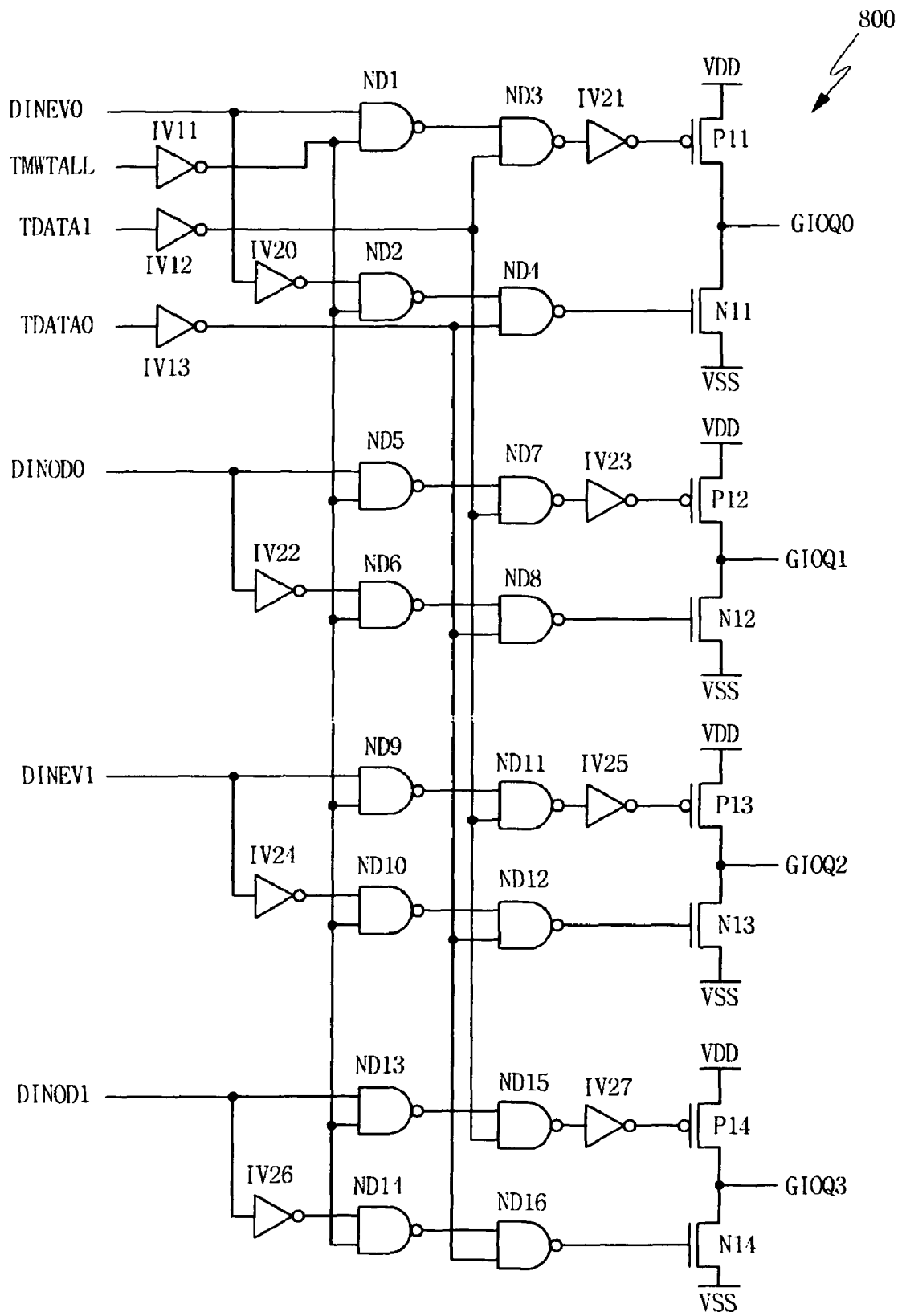
FIG. 5 illustrates a circuit diagram of a write driver shown in FIG. 3.

FIG. 3 illustrates a block diagram of a write driving circuit according to an exemplary embodiment of the present disclosure, FIG. 4 illustrates a circuit diagram of an input buffer controller shown in FIG. 3, and FIG. 5 illustrates a circuit diagram of a write driver shown in FIG. 3.

Referring to FIG. 3, the write driving circuit includes an input buffer 500, a latch 600, a serial-to-parallel converter 700, an input buffer controller 900 and a write driver 800. The input buffer 500 buffers an input signal. The latch 600 latches an output signal of the input buffer 500. The serial-to-parallel converter 700 converts an output signal of the latch 600 into parallel signals. The input buffer controller 900 generates a control signal ENDIN to the input buffer 500 in response to a test mode signal TMWTALL. The write driver 800 drives a global input/output line (GIO) in response to first and second data signals TDATA0 and TDATA1, regardless of a data signal input from the serial-to-parallel converter 700. While the write driving circuit illustrated in FIG. 3 is an example directed to an X16 DDR2 semiconductor memory, the present invention is not limited thereto. The write driving circuit may also be applied to other types of semiconductor memory devices.

Referring to FIG. 4, the input buffer controller 900 includes a logic device ND100 configured to perform a NAND operation on an inverted signal of the test mode signal TMWTALL and the write enable signal WTEN. That is, in a write mode, the input buffer controller 900 generates an active signal ENDIN to the input buffer 500 in response to the write enable signal WTEN and the test mode signal TMWTALL, allowing the same data to be output to global input/output (hereinafter referred to as "GIO") lines.

Referring to FIG. 5, the write driver 800 includes first operation units ND1 and ND2, a second operation unit ND3, a third operation unit ND4, and drive units P11 and N11. The first operation units ND1 and ND2 perform logic operations on the test mode signal TMWTALL and the output signal DINEV0 of the serial-to-parallel converter 700. The second operation unit ND3 performs a logic operation on an output signal of the first operation unit ND1 and a first test data signal TDATA1. The third operation unit ND4 performs a logic operation on an output signal of the first operation unit ND2 and a second test data signal TDATA0. The drive units P11 and N11 drive GIO line GIOQ0 in response to output signals of the second operation unit ND3 and the third operation unit ND4.

Operations of the write driving circuit according to an exemplary embodiment is explained below with reference to FIGS. 3-5.

Specifically, the input buffer 500 (501-516) converts data signals DIN<0:15>, which are input through data input pads, into CMOS level signals.

In the write mode, the input buffer controller 900 generates an active signal ENDIN to the input buffer 500 in response to the write enable signal WTEN and the test mode signal TMWTALL, allowing the same data to be output to the global input/output lines.

The latch 600 (601-616) latches output signals of the input buffer 500 according to a strobe signal (not shown).

The serial-to-parallel converter 700 (701-716) converts serial data signals having passed the input buffer 500 and the input latch 600 into parallel data signals. Bit data input on a 1-bit basis is converted into 4-bit data by the serial-to-parallel converter 700.

The write driver 800 drives the 4-bit data to the GIO lines.

FIG. 4 illustrates a circuit diagram of the input buffer controller according to an exemplary embodiment of the present disclosure. In a normal mode, the test mode signal TMWTALL has a logic low level and an output signal of an inverter IV100 has a logic high level. Therefore, an output signal ENDIN having passed through the operation unit ND100 and an inverter IV101 has the same logic level as that of the write enable signal WTEN.

When the test mode signal TMWTALL is activated to a logic high level, the output signal of the inverter IV100 has a logic low level. Therefore, the signal ENDIN is fixed to a logic low level, regardless of the logic level of the write enable signal WTEN, thereby disabling the input buffer 500.

FIG. 5 illustrates a circuit diagram of the write driver 800 according to an exemplary embodiment of the present invention. The write driver 800 receives 4-bit signals DINEV0, DINOD0, DINEV1 and DINOD1 from the serial-to-parallel converter 700, and outputs signals GIOQ0, GIOQ1, GIOQ2 and GIOQ3.

In a normal mode, the signals TMWTALL, TDATA1 and TDATA0 have a logic low level, so that output signals of inverters IV11, IV12 and IV13 have a logic high level.

Accordingly, when the signal DINEV0 has a logic high level, both of a signal having passed through operation units ND1 and ND3 and an inverter IV21 and a signal having passed through an inverter IV20 and operation units ND2 and ND4 have a logic low level. Therefore, a PMOS P11 is turned on and an NMOS N11 is turned off, so that a signal GIOQ0 has a logic high level.

When the signal DINEV0 has a logic low level, both of a signal having passed through the operation units ND1 and ND3 and the inverter IV21 and a signal having passed through the inverter IV20 and the operation units ND2 and ND4 have a logic high level. Therefore, the PMOS P11 is turned off and the NMOS N11 is turned on, so that a signal GIOQ0 has a logic low level.

Operations of inverters IV22 to IV27, operation units ND5 to ND16, PMOS transistors P12 to P14 and NMOS transistors N12 to N14 configured to receive signals DINOD0, DINEV1 and DINOD1 and output respective signals GIOQ1, GIOQ2 and GIOQ3 are the same as those of the inverters IV20 and IV21, the operation units ND1 to ND4, the PMOS transistor P11 and the NMOS transistor N11 configured to receive the signal DINEV0 and output the signal GIOQ0.

In a test mode, when a signal TMWTALL has a logic high level, all of the signals input to the operation units ND1, ND2, ND5, ND6, ND9, ND10, ND13 and ND14 have a logic low level, so that the PMOS transistors P11 to P14 and NMOS transistors N11 to N14 do not have the same logic levels as those of the signals DINEV0, DINOD0, DINEV1 and DINOD1, respectively.

When all of the signals GIOQ0 to GIOQ3 need to have a logic high level in this mode, the signal TDATA1 and the signal TDATA0 are required to have a logic high level and a logic low level, respectively. When the signal TDATA1 has a logic high level, input signals of the PMOS transistors P11 to P14 have a logic low level, so that the signals GIOQ0 to GIOQ3 are driven at a logic high level. In this case, the NMOS transistors N11 to N14 are turned off because the signal TDATA0 has a logic low level.

When the signal TMWTALL has a logic high level, the signal TDATA1 has a logic low level, and the signal TDATA0 has a logic high level, the input signals of the NMOS transistors N11 to N14 have a logic high level, so that the signals GIOQ0 to GIOQ3 are driven at a logic low level. In this case, the PMOS transistors P11 to P14 are turned off because the signal TDATA1 has a logic low level.

In other words, if one of the signals TDATA1 and TDATA0 is set to have a logic high level and the other is set to have a logic low level, with the test mode signal TMWTALL being set to have a logic high level, all of the signals GIOQ0 to GIOQ3 will have the same logic level. Therefore, the GIO lines can be driven by controlling only the test mode signal without the operations of the input buffer 500, the input latch 600 and the serial-to-parallel converter 700.

Hence, voltage levels of GIO lines can be transferred to a memory cell block when the write command is input one time, without the need of a data input pin.

As described above, the GIO lines can be driven using only the test mode signal, instead of inputting data through the data input pins.

Further, an input pattern of a test program can be simplified because the GIO lines are directly driven regardless of input data.

Further, the number of data pins can be minimized because data input pins for the write operation are not required except the data pin for a data decision of the read operation in the burn-in test.

Accordingly, a multi-chip parallel test can be performed, thereby improving efficiency of the burn-in test.

Moreover, the data input circuit can be disabled in the normal mode of generating input signal of the GIO driver, thereby reducing the current consumption of the semiconductor memory device.

While the present invention has been described with respect to specific examples and exemplary embodiments, it will be apparent to those skilled in the art that various changes and modifications may be made without departing from the spirit of this disclosure and scope of the following claims.

The present application claims priority to Korean patent application number 10-2007-0085154, filed on Aug. 23, 2007, the entire contents of which are incorporated herein by reference.

What is claimed is:

1. A write driving circuit comprising:
   a first operation unit configured to perform a first logic operation on a test mode signal;
   a second operation unit configured to perform a second logic operation on an output signal of the first operation unit and a first test data signal;
   a third operation unit configured to perform a third logic operation on the output signal of the first operation unit and a second test data signal; and
   a driving unit configured to drive a global input/output line in response to an output signal of the second operation unit and an output signal of the third operation unit.

2. The write driving circuit of claim 1, wherein the driving unit comprises:
   a pull-up driver configured to perform a pull-up operation in response to an inverted signal of the output signal of the second operation unit; and
   a pull-down driver configured to perform a pull-down operation in response to the output signal of the third operation unit.

3. A write driving circuit comprising:
   an input buffer configured to buffer an input data signal, the input buffer being disabled in a test mode;
   a latch configured to latch an output signal of the input buffer;
   a serial-to-parallel converter configured to convert an output signal of the latch into parallel data signals; and
   a write driver configured to drive a global input/output line in response to a first test data signal and a second test data signal in the test mode, regardless of the parallel data signals from the serial-to-parallel converter.

4. The write driving circuit of claim 3, wherein the write driver is configured to write same data on memory cells according to a combination of the first test data signal and the second test data signal in the test mode.

5. The write driving circuit of claim 3, wherein the write driver comprises:
   an operation unit configured to perform a logic operation on a test mode signal, the first test data signal, and the second test data signal; and
   a driving unit configured to drive the global input/output line in response to an output signal of the operation part.

6. The write driving circuit of claim 5, wherein the operation unit comprises:
   a first operation unit configured to perform a first logic operation on the test mode signal;
   a second operation unit configured to perform a second logic operation on an output signal of the first operation unit and the first test data signal; and
   a third operation unit configured to perform a third logic operation on the output signal of the first operation unit and the second test data signal.

7. The write driving circuit of claim 3, wherein the write driver comprises:
   a first operation unit configured to perform a first logic operation on a test mode signal;
   a second operation unit configured to perform a second logic operation on an output signal of the first operation unit and the first test data signal;
   a third operation unit configured to perform a third logic operation on the output signal of the first operation unit and the second test data signal; and
   a driving unit configured to drive the global input/output line in response to an output signal of the second operation unit and an output signal of the third operation unit.

8. The write driving circuit of claim 7, wherein the driving unit comprises:
   a pull-up driver configured to perform a pull-up operation in response to an inverted signal of the output signal of the second operation unit; and
   a pull-down drive unit configured to perform a pull-down operation in response to the output signal of the third operation unit.

9. A write driving circuit comprising:
   an input buffer configured to buffer an input data signal;
   a latch configured to latch an output signal of the input buffer;
   a serial-to-parallel converter configured to convert an output signal of the latch into parallel data signals;
   an input buffer controller configured to output a control signal for controlling the input buffer in response to a test mode signal; and
   a write driver configured to drive a global input/output line in response to a first test data signal and a second test data signal in the test mode, regardless of the parallel data signals from the serial-to-parallel converter.

10. The write driving circuit of claim 9, wherein the write driver is configured to write same data on memory cells according to a combination of the first test data signal and the second test data signal in the test mode.

11. The write driving circuit of claim 9, wherein the write driver comprises:
   an operation unit configured to perform a logic operation on the test mode signal, the first test data signal, and the second test data signal; and
   a driving unit configured to drive the global input/output line in response to an output signal of the operation part.

12. The write driving circuit of claim 11, wherein the operation part comprises:
   a first operation unit configured to perform a first logic operation on the test mode signal;
   a second operation unit configured to perform a second logic operation on an output signal of the first operation unit and the first test data signal; and
   a third operation unit configured to perform a third logic operation on the output signal of the first operation unit and the second test data signal.

13. The write driving circuit of claim 9, wherein the write driver comprises:
   a first operation unit configured to perform a first logic operation on the test mode signal;
   a second operation unit configured to perform a second logic operation on an output signal of the first operation unit and the first test data signal;

a third operation unit configured to perform a third logic operation on the output signal of the first operation unit and the second test data signal; and a driving unit configured to drive the global input/output line on an output signal of the second operation unit and an output signal of the third operation unit.

14. The write driving circuit of claim 13, wherein the driving unit comprises:

a pull-up driver configured to perform a pull-up operation in response to an inversion signal of the output signal of the second operation unit; and a pull-down drive unit configured to perform a pull-down operation in response to the output signal of the third operation unit.

15. The write driving circuit of claim 9, wherein the input buffer controller is configured to output a control signal for disabling the input buffer in the test mode.

16. The write driving circuit of claim 9, wherein the input buffer controller comprises a logic unit configured to perform a logic operation in response to the test mode signal and a write enable signal.

17. The write driving circuit of claim 16, wherein the logic unit comprises a logic device configured to perform a NAND operation in response to an inverted signal of the test mode signal and the write enable signal.

* * * * *